(12) United States Patent
Böttner et al.

(10) Patent No.: US 7,084,502 B2
(45) Date of Patent: Aug. 1, 2006

(54) MICROELECTROMECHANICAL DEVICE AND METHOD FOR PRODUCING IT

(75) Inventors: Harald Böttner, Freiburg (DE); Axel Schubert, München (DE); Joachim Nurnus, Neuenburg-Zienken (DE); Martin Jagle, Sexau (DE)

(73) Assignees: Infineon Technologies AG, Munich (DE); Fraunhofer - Gesellschaft zur Forde - rung der angewandten Forschung e. V., Munich ( * ) Notice: Subject to any disclaimer, the term of this patent is extended or adjusted under 35 U.S.C. 154(b) by 0 days.

(21) Appl. No.: 10/773,114

(22) Filed: Feb. 4, 2004

(65) Prior Publication Data
US 2004/0241994 A1    Dec. 2, 2004

(30) Foreign Application Priority Data
Jun. 2, 2003    (DE) ................ 103 05 411

(51) Int. Cl.
*H01L 23/48*    (2006.01)
*H01L 21/00*    (2006.01)
*H01L 21/76*    (2006.01)

(52) U.S. Cl. .............. 257/747; 438/55; 438/445
(58) Field of Classification Search ........ 438/55; 257/930, 467
See application file for complete search history.

(56) References Cited

U.S. PATENT DOCUMENTS

| | | | | |
|---|---|---|---|---|
| 5,547,598 A | * | 8/1996 | Amano et al. | ........ 252/62.3 T |
| 6,410,840 B1 | * | 6/2002 | Sudo et al. | ........ 136/201 |
| 2001/0009800 A1 | * | 7/2001 | Hijzen et al. | ........ 438/589 |
| 2002/0053359 A1 | | 5/2002 | Harman et al. | |
| 2002/0158281 A1 | * | 10/2002 | Goldbach et al. | ........ 257/296 |
| 2003/0006470 A1 | | 1/2003 | Franson et al. | |

FOREIGN PATENT DOCUMENTS

| | | |
|---|---|---|
| DE | 198 45 104 A1 | 4/2000 |
| DE | 101 11 185 A1 | 6/2002 |
| EP | 1079445 A2 * | 2/2001 |

\* cited by examiner

*Primary Examiner*—Nathan J. Flynn
*Assistant Examiner*—Benjamin P. Sandvik
(74) *Attorney, Agent, or Firm*—Dickstein, Shapiro, Morin & Oshinsky, LLP.

(57) ABSTRACT

A microelectromechanical device and a method for producing it having at least one layer on a substrate, in particular a thermoelectric layer on a substrate, the thermal expansion coefficient of the at least one layer and the thermal expansion coefficient of the substrate differing greatly. The at least one layer is coupled to at least one stress reduction means for the targeted reduction of lateral mechanical stresses present in the layer. This achieves a stress-free layer or enables stress-free growth.

13 Claims, 4 Drawing Sheets (A - A)

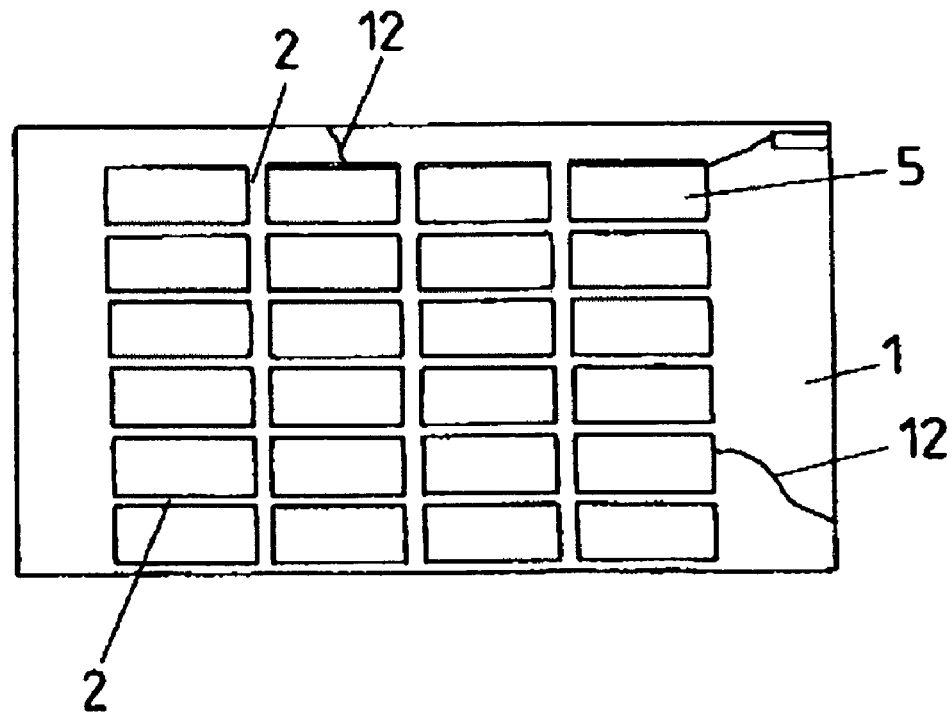

(B-B)

MICROELECTROMECHANICAL DEVICE AND METHOD FOR PRODUCING IT

FIELD OF THE INVENTION

The invention relates to microelectromechanical devices and to methods for producing microelectromechanical devices.

BACKGROUND OF THE INVENTION

During the production of microelectromechanical devices, e.g. thermogenerators or Peltier elements, layers are usually arranged (e.g. deposited, grown, etc.) on a substrate.

The published patent application DE 198 45 104 A1 describes, inter alia, a method for producing thermoelectric transducers, preferably produced by standard wafers appertaining to microelectronics, such as $Si/SiO_2$. In this case, different components are produced from two substrate wafers, coated with the respective complementary n/p-type materials (sandwich design). Substrate wafers are standard wafers prepared, inter alia, in accordance with the teaching of DE 198 45 104 A1 for coating with thermoelectric material for device production.

On account of the differences in the thermal expansion coefficients between the thermoelectric material and the substrate of almost a decade, chipping or cracking must be reckoned with in the case of layers exhibiting little or poor adhesion and curvature of the substrate wafer must be reckoned with in the case of layers exhibiting very good adhesion.

It is equally known from the prior art that thermoelectric materials with high quality have been grown successfully on other substrates as well, such as mica, glass and $BaF_2$ (see e.g.: Zou, H. et al., "Preparation and characterization of p-type $Sb_2Te_3$ and n-type $Bi_2Te_3$ thin films grown by coevaporation", J. Vac. Sci. Technol. A (2001), Vol. 19, No. 3, pp. 899–903 and Boikov, Yu. A. et al, "Layer by layer growth of $Bi_2Te_3$ epitaxial thermoelectric heterostructures" Proc 16th International Conference on Thermoelectrics, Dresden, Germany, August 1997, pp. 89–2).

This prior art discloses that exclusively layers in the range of a few hundred nm to 1–3 μm were produced by the various thin-film methods mentioned therein. Larger layer thicknesses were not achieved, on the one hand owing to growth times that were too long for technical utilization and on the other owing to the expected problems on account of the different thermal expansion coefficients.

An exception is layers of IV-VI compounds, lead chalcogenides, on $BaF_2$ (Harmann, T. C., et al.: "High thermoelectric figures of merit in PbTe Quantum Wells", Electronic Mater., Vol. 25, No. 7 (1996), pp. 1121–1227). Layer thicknesses of more than 5 μm can be achieved here. This is because of the matched lattice constants of the materials and the likewise matched thermal expansion coefficients.

Although layer thicknesses of more than 5 μm are reported for V-VI compounds as well, nothing is said about substrates used or possible device technologies (see R. Venkatasubramanian et al.; "Thin-Film thermoelectric devices with high room-temperature figures of merit", Nature, Vol 43, Oct. 11, 2001, 597–602).

The known technical solutions, stress-free growth of sufficient layer thicknesses of a few micrometers up to tens of μm is not possible with respect to all currently known substrates, in particular for utilization in thermoelectric components (e.g. Peltier elements and thermogenerators).

Stress-free is understood here to mean that the lateral mechanical stresses in a layer are intended to be as small as possible. Complete prevention of lateral mechanical stresses is technically virtually impossible to realize, but it is possible to realize a state in which the lateral stresses still present have no adverse effects.

Stress-free growth is furthermore necessary in order that the application of thermoelectric layers becomes readily accessible to the customary processes appertaining to microelectronics, in particular photolithographic processes and etching methods (in this respect, see DE 198 45 104 A1 and the article by H. Böttner et al.: "New Thermoelectric components in Micro-System-Technologies". Proc. 6th Workshop European Thermoelectric Society (ETS), Freiburg, (2001)).

The disadvantages of the prior art are thus apparent: thin-film-thermoelectric components, in particular, are not accessible for customary technical utilization with the necessary layer thicknesses.

SUMMARY OF THE INVENTION

The present invention addresses the problems associated with the prior art by providing a microelectromechanical device and a method for producing it in which a stress-free layer is present and, respectively, stress-free growth is possible even for layer thicknesses of >>10 μm.

In the case of a device according to the invention, at least one layer is coupled to at least one stress reduction means for the targeted reduction of lateral mechanical stresses present in the layer. A device is understood here to mean e.g. an intermediate product (e.g. a patterned wafer) or a microelectromechanical component.

In this case, it is advantageous if at least one stress reduction means is arranged between regions of a functional structure and/or a region with a thermoelectric layer.

One advantageous refinement consists in the fact that at least one region of a substrate has an antiadhesion layer for reducing or preventing the adhesion of material of the layer and thus for forming at least one stress reduction means. It is particularly advantageous if the antiadhesion layer has a Ti—W alloy or $SiO_2$ or comprises a Ti—W alloy or $SiO_2$. The antiadhesion layer makes it possible to produce a lateral "gap" in a layer in a targeted manner, which prevents a build up of stress over a relatively large area. The gap as stress reduction means is coupled to the layer to be interrupted. The spacing between adjacent gaps is determined both on the desired minimization of stress, and on the size of the devices formed on the substrate. In one embodiment, adjacent gaps are spaced apart by a distance in the range of 1.4 mm and 20 mm.

In a further advantageous refinement, a vertical offset between two laterally adjoining layers is arranged as stress reduction means in at least one region on the substrate. It is particularly advantageous if the vertical offset is formed by a prestructuring of the substrate, in particular with electrode metal and/or an adhesion layer. The deliberate production of a vertical offset makes it possible to provide a stress reduction means.

Furthermore, it is advantageous if at least one mechanically and/or chemically produced trench is arranged as stress reduction means in at least one region of the substrate. It is advantageous if at least one trench has a depth of up to 100 μm.

The method is particularly effective if the difference between the thermal expansion coefficient of at least one layer and the thermal expansion coefficient of the substrate is at least $3*10^{-6}$ K$^{-1}$, in particular at least $10^{-5}$ K$^{-1}$ (for deposition temperatures in the range of 200° C. to 400° C.; for higher deposition temperatures even smaller differences of the lateral thermal expansion result in measurable stresses). There is an increased risk of mechanical strain at these orders of magnitude.

It is advantageous if the layer thickness of a thermoelectric layer is between 2 and 100 μm. It is particularly advantageous for layer thicknesses of between 20 and 100 μm.

A substrate which at least partly comprises mica, glass, BaF$_2$, silicon, silicon dioxide, silicon carbide and/or diamond is advantageously used. Substrates having a high thermal conductivity (e.g. silicon, diamond) are particularly advantageous in this case.

It is particularly advantageous if at least one semiconductor component composed of two substrates is used. This is advantageous for a Peltier element and/or a thermogenerator element, produced e.g. in a sandwich design. For such microelectromechanical devices, it is advantageous if the thermoelectric layer has a proportion of typical thermoelectric compounds, in particular Bi$_2$Te$_3$-related, PbTe-related, SiGe-related and/or skutterrudite-type compounds.

According to another embodiment of the invention, a layer (e.g. a thermoelectric layer) on a substrate is coupled to at least one stress reduction means for the targeted reduction of lateral mechanical stresses present in the layer. A method for the stress-reduced growth of materials, in particular thermoelectric layers, is thus provided. It is possible to achieve stress relief, even given a temperature difference of a few 100° K. between the typical growth temperature of approximately 300° C. for thermoelectric layers and the subsequent typical operating temperature under normal conditions.

In this case, it is advantageous if at least one stress reduction means is arranged between regions of a functional structure and/or a region with a thermoelectric layer.

In a further advantageous refinement of the method according to the invention, an antiadhesion layer for reducing or preventing the adhesion of material of the layer and thus for forming at least one stress reduction means is grown in at least one region of the substrate.

It is also advantageous if a vertical offset between two laterally adjoining layers is arranged as stress reduction means in one region on the substrate.

Furthermore, it is advantageous if at least one trench is produced mechanically and/or chemically as stress reduction means in at least one region of the substrate.

BRIEF DESCRIPTION OF THE DRAWINGS

The invention is explained in more detail below using a plurality of exemplary embodiments with reference to the figures of the drawings, in which:

FIG. 4 shows a tracing of a microscopic plan view of a structured substrate in accordance with the second exemplary embodiment with cracks outside electrode regions;

DETAILED DESCRIPTION OF THE DRAWINGS

Even though examples for the arrangement of thermoelectric layers are specified below, the teaching according to the invention nevertheless also encompasses other materials between which there are greater differences in the thermal expansion coefficients.

EXEMPLARY EMBODIMENT 1

Laterally Self-structuring Layers Made of Thermoelectric Material

The considerable differences in the thermal expansion coefficients α of the materials necessary for constructing thermoelectric components, in accordance with DE 198 45 104 A1 cause considerable mechanical strains. This is apparent in particular when using Si/SiO$_2$ substrates:

| | | |
|---|---|---|
| α | (Bi$_2$Te$_3$)= | 13–21 * 10$^{-6}$ K$^{-1}$ (thermoelectric material), |
| α | (Si)= | 2.5 * 10$^{-6}$ K$^{-1}$, |
| α | (SiO$_2$)= | 0.5 * 10$^{-6}$ K$^1$. |

The resulting effect is manifested even with simple optical measurements in the case of thermoelectric layers 1 on 4" Si/SiO$_2$ substrates. Curvatures of a few millimeters can be measured. It is known from our investigations that layers which can be expediently utilized thermoelectrically for Peltier coolers and thermogenerators (e.g. thicknesses of $\geq$20 μm) also tend toward chipping on account of the abovementioned differences in the thermal expansion coefficients, thus e.g. on specific substrates such as Si/SiO$_2$ and/or TiW alloys.

A substrate is in this case a material composite having the highest possible conductance with a covering layer made of an electrical insulator that is as thin as possible.

In a first embodiment of the invention (FIGS. 1, 2), a thermoelectric layer 1 is coupled to a stress reduction means 2 for the targeted reduction of lateral mechanical stresses present in the layer 1.

Figure 1:
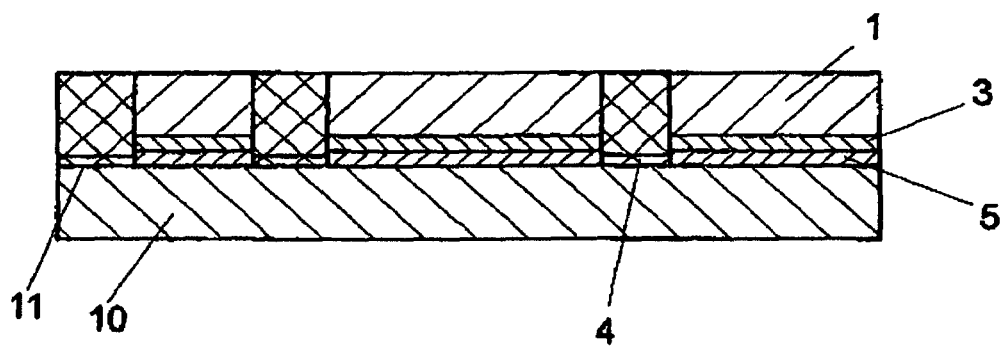
FIG. 1 shows a diagrammatic illustration of a first stage in the production of a first exemplary embodiment of the device according to the invention.
Figure 2:
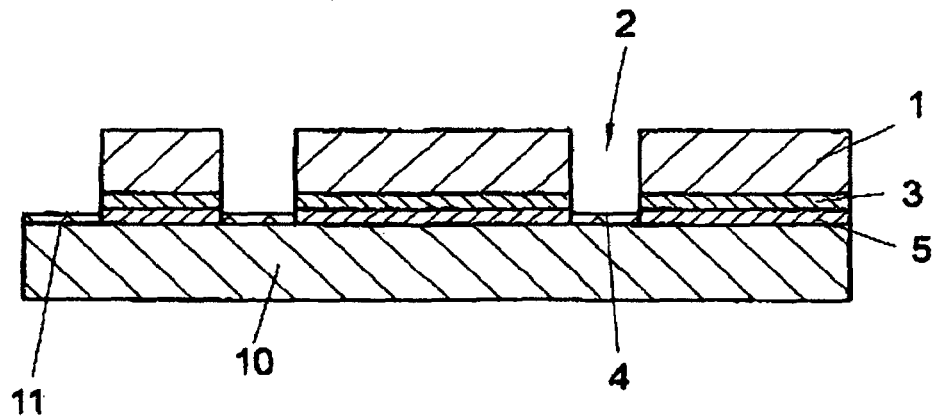
FIG. 2 shows a diagrammatic illustration of a second stage in the production of a first exemplary embodiment of the device according to the invention.

FIG. 1 illustrates that below the thermoelectric layer 1, on a substrate surface 11, an adhesion layer 3 is arranged in regions and an antiadhesion layer 4 is arranged in other regions. The antiadhesion layer 4 is formed such that the thermoelectric layer 1 does not adhere, or adheres only very poorly, on the antiadhesion layer 4. In the present example, the adhesion layer 3 is formed as a thin gold layer. As an alternative, tin, lead or similar layers may also be used as the adhesion layer 3. The layer thickness is in the nanometers range. The adhesion layer 3 is arranged above an electrode layer 5.

The antiadhesion layer 4 has SiO$_2$ or a Ti—W alloy or completely comprises these materials. The thermoelectric layer 1 adheres only poorly or not at all on the materials mentioned.

The thermoelectric material grows on a wafer as substrate 10 (e.g. by means of PVD), which is structured. Although thermoelectric material grows in the region of the antiadhesion layer 4, it is only weakly, under certain circumstances only mechanically, interlinked.

The weakly adhering material can be detached by means of a corresponding aftertreatment, such as, for example, by means of ultrasound. The construction of the sample then has the appearance as in FIG. 2 in cross section. The thermoelectric layer 1 is removed above the regions of the antiadhesion layer 4, so that a lateral structuring has been achieved. The thermoelectric layer 1 in the region above the adhesion layer 3 is thus coupled to a gap 2 as stress reduction means.

As an alternative (e.g. in the case of a Ti—W alloy layer), it is possible for no growth of a thermoelectric layer 1 to take place in the region of the antiadhesion layer 4, so that an aftertreatment is superfluous. The Ti—W layer can be used as an adhesion promoter for electrodes. The antiadhesion layer 3 is removed during the production of components with such thermoelectric layers in the course of the corresponding technological processes.

In any event, the stress reduction means 2 according to the invention is produced here as lateral self-structuring during the layer growth.

EXEMPLARY EMBODIMENT 2

Defined Cracking Through Geometrical Desired Breaking Points Along Vertical Structure Edges So-called "Breakwater Structures" for Eliminating Lateral Stresses The considerable differences in the thermal expansion coefficients α of the materials necessary for the construction of thermoelectric components, in accordance with the published patent application mentioned above, cause considerable mechanical strains. This becomes clear particularly when using $Si/SiO_2$ substrates:

| | | |
|---|---|---|
| α | $(Bi_2Te_3)=$ | $13-21 * 10^{-6} K^{-1}$ (thermoelectric material), |
| α | $(Si)=$ | $2.5 * 10^{-6} K^{-1}$, |
| α | $(SiO_2)=$ | $0.5 * 10^{-6} K^{1}$. |

This effect is clearly manifested even with simple optical measurements in the case of thermoelectric layers on 4" $Si/SiO_2$ substrates 10. Curvatures of a few millimeters can be measured. The necessary adhesion of the thermoelectric materials is achieved by the introduction of adhesion layers 3. In this case, suitable conditions are to be complied with with regard to material, layer thickness and also the type of process implementation.

In contrast to the first exemplary embodiment, the second exemplary embodiment only works with an adhesion layer 3, which is necessary for the secure arrangement of the thermoelectric layer 1. This is illustrated diagrammatically in FIGS. 3, 3A.

Figure 3:
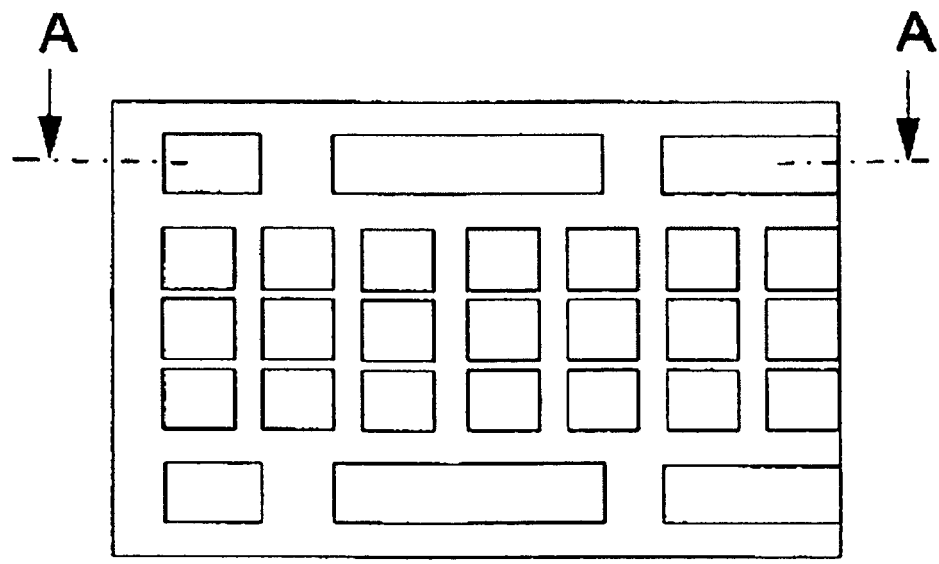
FIG. 3 shows a diagrammatic plan view of a structured substrate in accordance with a second exemplary embodiment.

FIG. 3 diagrammatically shows one possible overall arrangement using so-called "breakwater structures" for the reduction of the unavoidable lateral stresses. The illustration in accordance with FIG. 3 did not involve illustrating a plan view which corresponds to an actual apportioning into regions for the later utilization as thermoelectric components and into regions exclusively with a breakwater function.

Figure 3A:
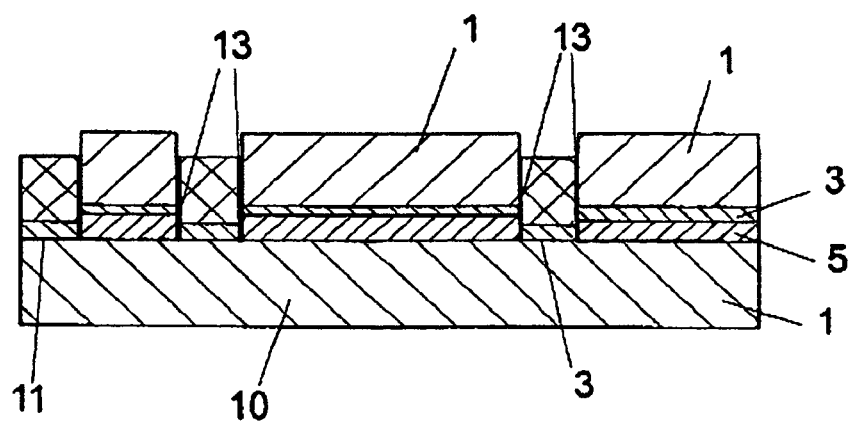
FIG. 3A shows a diagrammatic sectional view along the line A—A in FIG. 3.

FIG. 3 diagrammatically illustrates the appearance image of a plan view of a part of a wafer 10. FIG. 3A shows a sectional view in accordance with the section line illustrated in FIG. 3.

The black vertical lines 13 in FIG. 3A indicate the regions with solid growth disturbances; this represents the stress reduction means. Said growth disturbances are brought about by height differences of a few micrometers. A build up of stress through lateral connections of the layer 1 is avoided by virtue of the height differences which are utilized in a targeted manner.

In this exemplary embodiment, the adhesion layer 3 is applied over the whole area of the electrode metals 5, which have already been structured beforehand. The electrode metals 5 typically have a thickness of a few micrometers (e.g. 2 μm; see e.g. the above-cited article by Böttner et al.) The electrode metals 5 may be grown by means of physical and/or chemical coating methods.

On account of the prestructuring, an areally distributed height profile arises on the substrate 10, and prevents a uniform lateral growth of the layer 1 by virtue of growth disturbances directly at the level differences. The "desired breaking points" occurring at the vertical offset points represent the stress reduction means 2, which is produced in a targeted manner here.

The adhesion and the growth of the thermoelectric layer 1 as a dense material are not impaired by this procedure.

The effect of this structuring is manifested in the reduction of the lateral stress (tensile stress, compressive stress), thereby significantly reducing a curvature of the substrate 10 (wafer curvature). Such wafers are more readily accessible to a postprocessing particularly in photolithographic processors.

Microscopic examinations in dependence on the geometrical arrangement of structured contact metals and whole-area use of adhesion metal layers exhibit, in the case of hitherto customary dimensions and distributions of contact metal areas and non-contact metal areas, a systematism in the cracking in the thermoelectric layers 1 having a thickness of approximately 10 to 30 μm in the regions around and between the contact metal areas.

Coated areas of specific dimensions both for the contact metal areas and for the non-contact metal areas remain crack-free. In this case, crack-free areas of the thermoelectric material are generally significantly larger on the electrode areas than on the areas outside the electrode region.

FIG. 4 illustrates a diagrammatic reproduction of a microscopic representation of a wafer substrate with areas for electrode metal 5. The electrode metal areas 5 are separated by the above-described stress reduction means 2. The electrode metal 5 within the rectangular areas is crack-free since no or only very small mechanical stresses occur within said areas due to the stress reduction means 2. Outside these electrode areas 5, and only outside, cracks 12 are discernible.

The object of obtaining crack-free functional structures of sputtered thermoelectric material for e.g. 4" to 8" wafers is achieved according to the invention by virtue of the fact that, in accordance with the results of the abovementioned microscopic analysis, provision is made of further metal structures with the layer sequence as for the electrode areas with their typical height of approximately 2 μm and the required geometrical dimensions in length and width on the substrate surface. These structures, which effect the reduction of lateral stresses over the wafer, have further advantages for subsequent process steps by virtue of cracking being avoided in the thermoelectric material:

Advantages as a result of avoiding cracking in the functional structure:

undesirable penetration of e.g. photoresist or other liquids into cracks in the thermoelectric material and thus subsequently uncontrollable contamination or poor control of subsequent processes due to disturbing additional effects is avoided;

Advantages as a result of avoiding lateral stresses:

a macroscopic flexure of the wafer is reduced, and so subsequent photo-processes or coatings are facilitated or actually made possible.

EXEMPLARY EMBODIMENT 3

Stress Relief by Means of Front-sawn or Front-etched Wafers

In a third exemplary embodiment, stress reduction means 2 are introduced into the substrate 10 (and, possibly, into layers that have already been grown) in a mechanically and/or chemically targeted manner.

The substrate used may be e.g. processed 4"–8" base wafers in which a groove/trench pattern in a regular grid of depressions is sawn or etched into the wafer front side. The depth of said trenches may preferably be up to 100 µm. The growth of the thermoelectric layer 1 is disturbed by said trenches in such a way that it is possible to achieve a reduction of the stress—in the form of the reduction of the tension or pressure.

As a result, plateaus which are predefined geometrically and in terms of size are thus also present, which plateaus have the basic area for the construction of complete thermoelectric devices. Advantages of this arrangement are:

a periodic interruption against the build up of lateral stress;

a predefined desired breaking point; the latter is advantageous for the subsequent singulation of the components fabricated on the wafer.

The growth of the thermoelectric layer is disturbed by said trenches in such a way that it is possible to achieve a reduction of the stress—in the form of the reduction of the tension or pressure.

Figure 5:
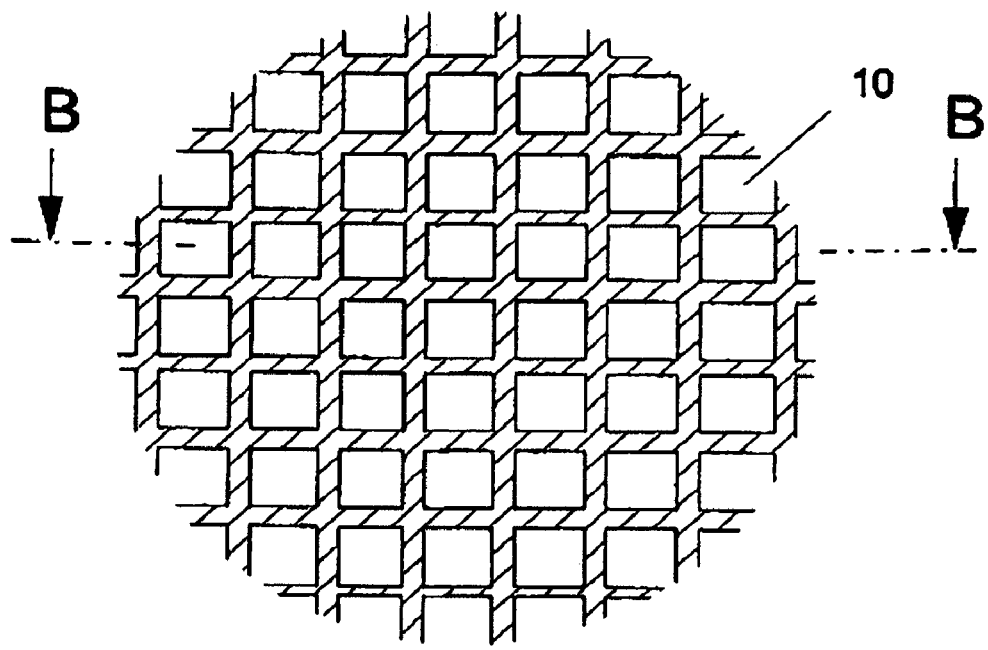
FIG. 5 shows a diagrammatic plan view of a substrate in accordance with a third exemplary embodiment.
Figure 5A:
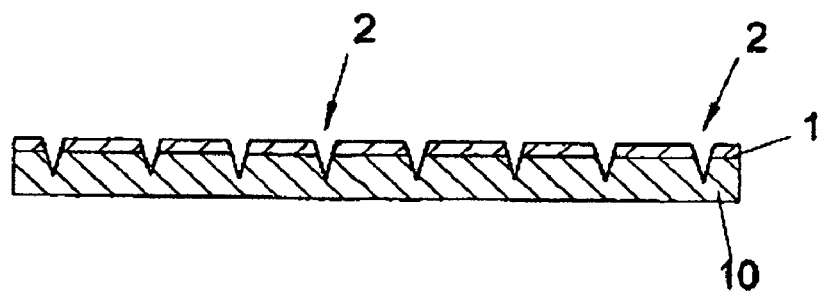
FIG. 5A shows a diagrammatic sectional view along the line B—B in FIG. 5.

FIG. 5 diagrammatically illustrates a plan view of a wafer 10 with etching or sawing trenches as stress reduction means 2. FIG. 5A likewise diagrammatically illustrates a sectional view through the wafer along the section line in FIG. 5. The sectional view clearly reveals the plateau arrangement—so-called "chocolate wafer". The width and arrangement of the etching or sawing trenches are variable and can thus also be used as a specification for the singulation of the components from the processed wafer. The depth of the trenches is in this case in the region of a few tens of µm; the width of the trenches for both embodiments (etching or sawing) is likewise in the region of a few tens of µm. The sawing grid may be either in the region of a number of millimeters, as indicated in FIG. 5, or in the region of the size of individual devices (see DE 198 45 104 A1). This means a sawing grid down to in the region of a few hundreds of µm.

The arrangement of the sawn or etched trenches may be performed before or after the arrangement of the layer in which the lateral stress reduction is intended to be effected.

The three exemplary embodiments show designs according to the invention which can also be combined with one another on a substrate 10, the variant to be chosen depending on the geometrical and functional conditions.

LIST OF REFERENCE SYMBOLS

1 Layer (thermoelectric)
2 Stress reduction means
3 Adhesion layer
4 Antiadhesion layer
5 Electrode metal
10 Substrate
11 Substrate surface
12 Crack
13 Line (stress reduction means)

The invention claimed is:

1. A microelectromechanical device comprising at least one thermoelectric layer on a substrate, wherein a thermal expansion coefficient of said at least one thermoelectric layer differs greatly from a thermal expansion coefficient of the substrate, wherein said at least one thermoelectric layer is coupled to at least one stress reduction means for the targeted reduction of lateral mechanical stresses present in the layer, wherein at least one stress reduction means is arranged between regions of at least one of a functional structure and a region with a thermoelectric layer, and wherein the stress reduction means comprises at least one of:

(a) an antiadhesion layer for reducing or preventing the adhesion of material of the layer and thus for forming at least one stress reduction means, (b) a vertical offset between two laterally adjoining layers is arranged as said stress reduction means in at least one region on the substrate, and (c) at least one trench is arranged as said stress reduction means in at least one region of the substrate.

2. The microelectromechanical device as claimed in claim 1, wherein the antiadhesion layer comprises at least one of Ti—W alloy and $SiO_2$.

3. The microelectromechanical device as claimed in claim 1, wherein the vertical offset is formed by a prestructuring of the substrate using at least one of an electrode metal and an adhesion layer.

4. The microelectromechanical device as claimed in claim 1, wherein at least one trench has a depth of up to 100 µm.

5. The microelectromechanical device as claimed in claim 1, wherein the substrate comprises at least one of mica, glass, $BaF_2$, silicon, silicon dioxide, silicon carbide and diamond.

6. The microelectromechanical device as claimed in claim 1, wherein said thermoelectric layer forms at least one of a Peltier element and a thermogenerator element.

7. The microelectromechanical device as claimed in claim 1, wherein the thermoelectric layer comprises a thermoelectric material including at least one of $Bi_2Te_3$, PbTe, SiGe and skutterrudite.

8. The microelectromechanical device as claimed in claim 1, wherein the difference between the thermal expansion coefficient of at least one layer and the thermal expansion coefficient of the substrate is at least $3*10^{-6}$ $K^{-1}$.

9. The microelectromechanical device as claimed in claim 8, wherein the difference between the thermal expansion coefficient of at least one layer and the thermal expansion coefficient of the substrate is at least $10^{-5}$ $K^{-1}$.

10. The microelectromechanical device as claimed in claim 1, wherein the layer thickness of said thermoelectric layer is in the range of 2 and 100 µm.

11. The microelectromechanical device as claimed in claim 10, wherein the layer thickness is in the range of 20 and 100 µm.

12. A method for producing a thermoelectric semiconductor component, the method comprising
forming a layer on a substrate such that the layer is coupled to at least one stress reduction means for the targeted reduction of lateral mechanical stresses present in the layer,
wherein forming the layer comprises forming a thermoelectric layer, and wherein the method further comprises arranging said at least one stress reduction means between regions of at least one of a functional structure and a region with a thermoelectric layer, and
wherein forming the stress reduction means comprises at least one of:
(a) forming an antiadhesion layer for reducing or preventing the adhesion of material of the layer and thus for forming at least one stress reduction means in at least one region of the substrate,
(b) arranging a vertical offset between two laterally adjoining layers as said stress reduction means in at least one region on the substrate, and
(c) producing at least one trench using at least one of mechanical and chemical processes as said stress reduction means in at least one region of the substrate.

13. A microelectromechanical device comprising:
a substrate having a first thermal expansion coefficient; and
a thermoelectric layer formed over the substrate, the thermoelectric layer having a second thermal expansion coefficient that differs from the first thermal expansion coefficient by at least $10^{-5}$ $K^{-1}$;
wherein said at least one thermoelectric layer is divided into a plurality of thermoelectric layer portions, each thermoelectric layer portion being separated from adjacent thermoelectric layer portions by a stress reduction region, and
wherein said each thermoelectric layer portion has a thickness in the range of 2 and 100 µm, and a width in the range of 1.4 to 20 mm, and
wherein each stress reduction region comprises at least one of:
(a) an antiadhesion layer for reducing or preventing the adhesion of material of the layer and thus for forming at least one stress reduction means,
(b) a vertical offset between two laterally adjoining layers is arranged as said stress reduction means in at least one region on the substrate, and
(c) at least one trench is arranged as said stress reduction means in at least one region of the substrate.

* * * * *

UNITED STATES PATENT AND TRADEMARK OFFICE
CERTIFICATE OF CORRECTION

PATENT NO. : 7,084,502 B2
APPLICATION NO. : 10/773114
DATED : August 1, 2006
INVENTOR(S) : Harald Böttner et al.

It is certified that error appears in the above-identified patent and that said Letters Patent is hereby corrected as shown below:

Title Page
    (75) Inventors: replace "Jagle" with --Jaegle--.

(73) Assignees: replace "Fraunhofer-Gesellschaft zur Forde - rung der angewandten Forschung e.V." with --Fraunhofer-Gesellschaft zur Forderung der angewandten Forschung e.V.--

Column 8, after line 7, insert --6 Stress direction (lateral stress)--.

Signed and Sealed this

Twelfth Day of December, 2006

JON W. DUDAS
*Director of the United States Patent and Trademark Office*